United States Patent [19]

Elias et al.

[11] 4,195,769

[45] Apr. 1, 1980

[54] METHOD AND APPARATUS FOR FAULT-TESTING OF ELECTRICAL SYSTEM MONITOR COMMUNICATION CIRCUITS

[75] Inventors: Jack Elias, Lansdale; Arthur M. Olen, Pennsbyrg, both of Pa.

[73] Assignee: Honeywell Inc., Minneapolis, Minn.

[21] Appl. No.: 914,786

[22] Filed: Jun. 12, 1978

[51] Int. Cl.² .............................................. G06F 11/00
[52] U.S. Cl. ..................................... 371/20; 324/73 R
[58] Field of Search ................ 235/302; 324/73 R, 51; 340/146.1 E

[56] References Cited

U.S. PATENT DOCUMENTS

| | | | |
|---|---|---|---|
| 3,012,722 | 12/1961 | Colten et al. | 235/302 |
| 3,034,051 | 6/1962 | Higgins, Jr. | 324/73 R |
| 3,096,511 | 7/1963 | Taras | 235/302 |
| 3,487,304 | 12/1969 | Kennedy | 324/73 R |
| 3,599,179 | 8/1971 | Arnold | 235/302 |
| 3,705,349 | 12/1972 | Arnold | 324/73 R |
| 3,792,349 | 2/1974 | Babbitt | 324/51 |
| 3,833,853 | 9/1974 | Milford | 324/73 R |
| 3,872,441 | 3/1975 | Callow | 364/900 |
| 3,922,537 | 11/1975 | Jackson | 235/302 |
| 4,055,801 | 10/1977 | Pike et al. | 324/73 R |

*Primary Examiner*—Charles E. Atkinson
*Attorney, Agent, or Firm*—Laurence J. Marhoefer; Lockwood D. Burton; Mitchell J. Halista

[57] ABSTRACT

A method for fault-testing of electrical apparatus includes the steps of interrupting the application of control signals normally producing changes in the electrical apparatus, disconnecting electrical apparatus monitoring circuits from energizing signal means used to produce output signals from the electrical apparatus monitoring circuits dependent on the state of electrical apparatus, and checking the subsequent output of monitoring circuits to detect the output signal to detect output signals during the deenergized state indicative of a fault in the monitoring circuits. An apparatus for performing the aforesaid testing method includes a digital computer having a stored test control program therein for selectively addressing the power supply connection means of the monitoring equipment to produce a deenergization of the monitoring equipment and means for checking the output of the monitoring equipment after the deenergization thereof.

4 Claims, 4 Drawing Figures

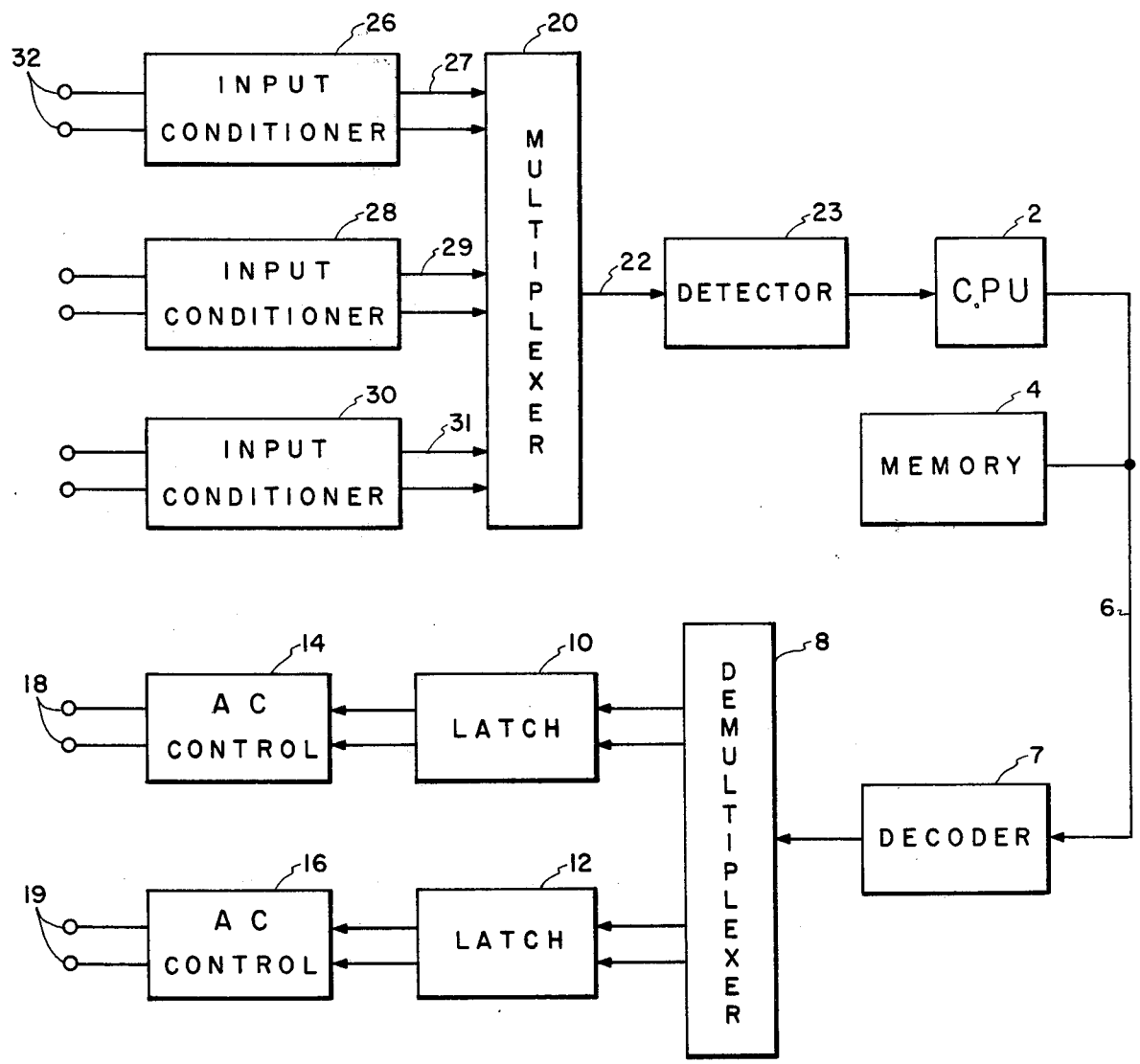
F I G. 1

METHOD AND APPARATUS FOR FAULT-TESTING OF ELECTRICAL SYSTEM MONITOR COMMUNICATION CIRCUITS

BACKGROUND OF THE INVENTION

1. Field Of The Invention

The present invention relates to testing equipment. More specifically, the present invention is directed to a method and apparatus for fault-testing of electrical equipment monitoring systems.

2. Description Of The Invention

The field of electrical process control includes the monitoring of a plurality of electrical equipment which is used to control the industrial process. The monitoring equipment includes field mounted devices, e.g., switches, located on valves, fans, motors, etc. which are used in various physical locations within the environmental confines of the industrial process being monitored. The monitoring equipment is arranged to produce respective output signals representative of the operation of the various process devices. These output signals are ultimately either reviewed by an operator or applied to a digital computer for data processing to produce new control signals for the equipment being monitored. While numerous computer controls test systems for testing devices under control of a computer program, or software, are available, e.g., the test systems shown in U.S. Pat. Nos. 3,237,100; 3,546,582; 3,581,074; 3,597,682; 3,599,091; 3,651,315; 3,705,349; 3,487,304 and 3,739,160, these computer control test systems have all failed to provide means for testing the circuits used for monitoring the equipment. Thus, while the computer program tested the equipment being monitored by various means, e.g., applying a test or reference signal thereto, the circuits actually connecting the test equipment to the computer were not specifically tested. Thus, a fault in the circuits providing the communication interface between the monitoring equipment and the computer could give rise to an erroneous indication of a fault or a problem in equipment operation whereas the converse could actually be the case. Accordingly, it is desirable to provide a test system for testing the communication system between the digital computer and the equipment being monitored.

SUMMARY OF THE INVENTION

An object of the present invention is to provide an improved method and apparatus for fault-testing of the electrical apparatus monitoring communication systems.

In accomplishing this and other objects, there has been provided, in accordance with the present invention, a method and apparatus for fault-testing of monitoring communication systems connected between field process control apparatus and a centrally located digital computer including the steps of initiating a test cycle including removing an energization signal from the monitoring equipment communication system, and testing the resulting output of the communication system to detect errors in the output signals during the deenergized state thereof.

BRIEF DESCRIPTION OF THE DRAWINGS

A better understanding of the present invention may be had when the following detailed description is read in connection with the accompanying drawings in which:

FIG. 1 is a block diagram of an example of a fault-testing system embodying the present invention;

DETAILED DESCRIPTION

Figure 2:
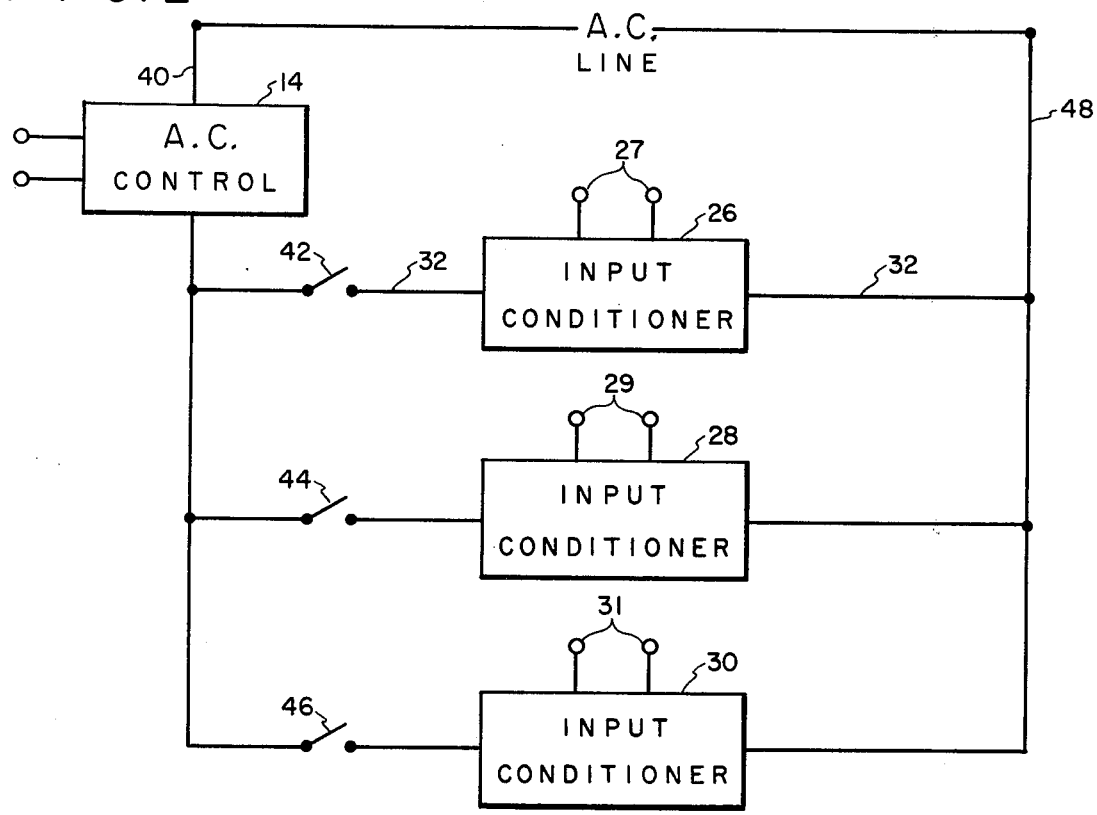
FIG. 2 is a block diagram of an example of the field connection details for the fault-testing systems shown in FIG. 1.

Referring to FIG. 1 in more detail, there is shown an example of a fault-testing system embodying the present invention. A central processing unit (CPU) 2, which conventionally may include an analog-to-digital converter, an arithmetic unit, a read-only memory, etc., is arranged to perform a program routine according to software, or program instructions, stored in a memory 4, such programs being well-known in the art. The digital computer 2 is arranged to receive and send digital data over a data bus 6 to the memory 4 and through a decoder 7 to a demultiplexer unit 8. The demultiplexer unit 8 may be any suitable well-known apparatus for receiving an input signal on an input signal line and sequentially distributing the input signal onto a plurality of output lines under control of control signals from the decoder 7. The output lines from the demultiplexer 8 are connected to respective ones of a plurality of latch circuits 10, 12. The output signal from the latch circuits, 10, 12 are connected to the input of respective ones of a plurality of alternating current, or AC, control circuits 14, 16, respectively. The output of each of the AC control circuits 14, 16 is arranged to control the connection of an AC line, e.g., the output terminals 18 from the AC control 14 are arranged to be connected in series with an AC line as described more fully hereinafter.

The CPU 2 is arranged to receive input signals from a multiplexer 20 which may be any suitable well-known device for receiving a plurality of input signals and sequentially applying them to an output line. Specifically, the multiplexer 20 has an output line 22 to which the input signals applied on a plurality of multiplexer input lines are sequentially connected. The output line 22 is connected, in turn, to the input of a signal shaping detector circuit 23 which is used to detect and amplify the signals from the multiplexer to prepare them for presentation to the CPU 2. The input lines to the multiplexer 20 are arranged to apply output signals from a plurality of input conditioners 26, 28 and 30. The input conditioners 26, 28 and 30 have input terminals for applying input signals to the input signal conditioners 26, 28 and 30. For example, the input signal conditioner 26 has a pair of input terminals 32 arranged to be connected to a source of an input signal for an application to the input signal conditioner 26 as hereinafter discussed. The sources of the input signals connected to the input signal conditioner 26, 28 and 30 are arranged to be energized by a source of an AC signal controlled by the AC control apparatus 14, 16 as discussed with respect to FIG. 2.

MODE OF OPERATION OF FIG. 1

In operation, the CPU 2 is arranged to be controlled by a predetermined test program stored in the memory 4 which program is periodically selected, e.g., once every three seconds, and is arranged to initially produce an output control signal from the CPU 2 which is applied to the demultiplexer 8 for application to the latches 10, 12. An output signal from the latches 10, 12 is applied, in turn, to the AC control apparatus 14, 16 to deenergize the output terminals 18, 19 thereof. Inasmuch as these AC signals are used to energize or produce the input signals for the input conditioners 26, 28 and 30, the CPU is subsequently directed by the stored program to accept sequential input signals from the multiplexer 20 to check on the condition of input signals applied to the input signal conditioners 26, 28 and 30. Upon the detection of the existence of an input signal from the multiplexer 20, the CPU 2 is arranged to detect the existence of a malfunction in the source of the input signals since under the operating conditions imposed by the deenergization of the AC control apparatus 14, 16 the existence of an input signal to the input conditioners 26, 28 and 30 is indicative of an error in the operation of the apparatus.

DESCRIPTION OF FIG. 2

FIG. 2 is a block diagram of a field circuit showing the AC control apparatus and the input signal conditioners 26, 28 and 30. The AC control apparatus is used in an AC line 40 connected to an AC source (not shown). The AC line 40 is connected through the AC control apparatus 14 to one side of a plurality of field monitoring switches 42, 44, and 46. The state of the field switches may be used to represent operation of process devices such as valves, fans, motors, coal feeders, etc. The other side of each of the field switches 40, 44 and 46 is connected through the input signal conditioners 26, 28 and 30 to the other side of the AC source by means of a neutral or return line 48.

MODE OF OPERATION OF FIG. 2

In operation, the field system shown in FIG. 2 is effective to produce an output signal from an input signal conditioner when a field switch is closed and the AC control apparatus 14 is arranged to apply an AC signal to the field switch. For example, if the AC control 14 is energized and AC is applied to the field switch 42, the closing of the field switch 42 is effective to apply an AC signal to the input conditioner 26 to produce an output signal on the output terminal 27. Similarly, the field switches 44 and 46 are effective to produce output signals on the output terminals of their respective input signal conditioners 28 and 30. The deenergization of the AC control apparatus 14 is effective to remove the AC signal from each of the field switches 42, 44 and 46 to terminate an output signal appearing on the input signal conditioner terminals 27, 29 and 31. The continued presence of an output signal on these output terminals 27, 29 and 31 is indicative of an error in the operation of the system and is monitored by the CPU 2 as previously discussed with relation to FIG. 1.

DESCRIPTION OF FIG. 3

Figure 3:
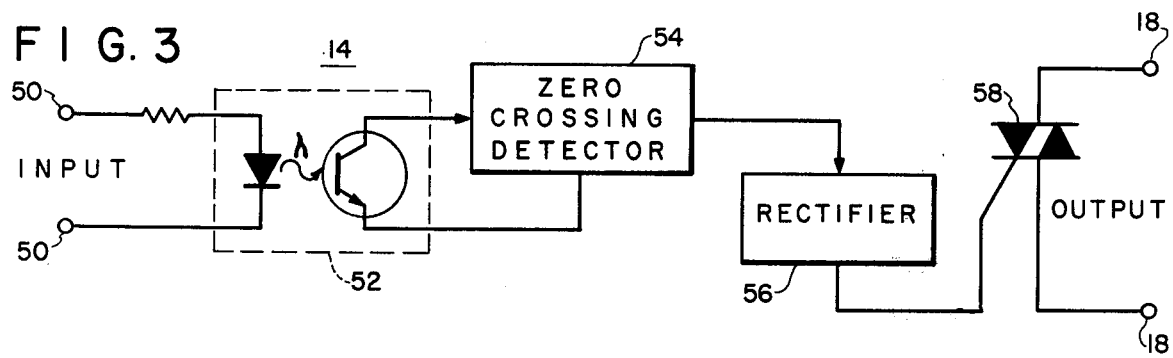
FIG. 3 is a schematic illustration of an example of the AC control suitable for use in the system shown in FIG. 1.

In FIG. 3, there is shown a block diagram of an example of a suitable AC control apparatus suitable for use as the AC control apparatus 14 and 15 shown in FIGS. 1 and 2. Such an AC control apparatus is manufactured by the Eagle Signal Division of Gulf and Western Manufacturing Co. of Davenport, Iowa and identified as an AC output block CP730A6. In operation, the control signal is applied to the input terminals 50 and is arranged to produce an output signal from the opto-isolator 52. The output of the optoisolator 52 is applied to a zero crossing detector to detect a transition in the input signal supplied to the input terminals 50. The output from the zero crossing detector is rectified by a rectifier 56 and is applied to the triggering electrode of a Triac to trigger the Triac into current conduction. The conductive state of the Triac provides a conducting path across the output terminals 18 to connect an AC signal therebetween. The output terminals 18 are connected in series with the AC line 40 shown in FIG. 2 to enable the AC control apparatus 14 to control the application of an AC signal to one side of the field switches 42, 44, 46. Accordingly, the control of the current conduction of the Triac 58 is effective to control the AC signal applied to the field switches 42, 44 and 46.

DESCRIPTION OF FIG. 4

Figure 4:
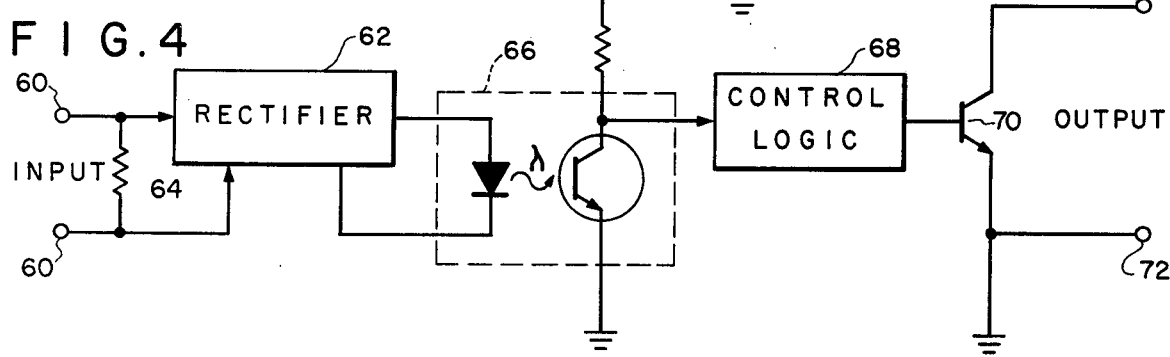
FIG. 4 is a detailed schematic of an example of the input signal conditioner suitable for use in the system showing FIG. 1.

In FIG. 4, there is shown a block diagram of an example of an input signal conditioner suitable for use as each of the input conditioners 26, 28 and 30 shown in FIGS. 1 and 2. Such an input conditioner apparatus is also manufactured by the aforesaid Eagle Signal Division as AC input, Solid State Relay CP720A6. In operation, the input terminals are connected in series with a corresponding one of the field switches 42, 44, 46 to enable an AC signal from a field switch to be passed through a rectifier 62 connected in parallel with a line resistor 64. An output signal from the rectifier 62 is applied to an opto-isolator 66 to produce an output signal therefrom. The output of the opto-isolator 66 is applied through a wave-shaping control logic 68 to an output transistor 70. The output transistor 70 is connected to a pair of output terminals 72 to apply the output signal from the control logic 68 thereto. In summary, the AC input signal from a field switch is converted to a DC signal and is applied to the output terminals 72.

Accordingly, it may be seen that there has been provided in accordance with the present invention, an improved method and apparatus for fault-testing of electrical system monitor communication circuits.

The embodiments of the invention in which an exclusive property or privilege is claimed are defined as follows:

1. A fault testing apparatus comprising
   a plurality of electrical signal switch means for selectively passing an electrical signal therethrough,
   an energizing signal source connecting means for selectively connecting one side of said switch means to an energizing signal source and responsive to a control signal for interrupting the connection to said source,
   a plurality of signal conditioning means connected to the other side of respective ones of said switch means to complete a circuit to said source and to produce an output signal representative of an operation of a corresponding one of said switch means, and
   monitoring means for detecting the output signals from each of said signal conditioning means and
   control signal generating means for producing said control signal for selectively interrupting said connection to said source by said switch means.

2. A fault testing apparatus as set forth in claim 1 wherein the energizing signal is an AC signal, said switch means includes a plurality of electrical switches arranged to respond to the operation of associated equipment and said signal conditioning means each include an AC to DC conversion means.

3. A fault testing apparatus as set forth in claim 2 wherein said control signal generating means includes a digital computer controlled by a stored program to periodically generate said control signal.

4. A fault testing apparatus as set forth in claim 3 wherein said monitoring means includes a signal detector and a signal multiplexer for sequentially applying each output signal from said signal conditioning means to an input of said signal detector.

* * * * *